(12) United States Patent
Salmela et al.

(10) Patent No.: US 7,531,755 B2
(45) Date of Patent: May 12, 2009

(54) TRIMMING OF EMBEDDED STRUCTURES

(75) Inventors: Olli Salmela, Helsinki (FI); Ilpo Kokkonen, Oulu (FI)

(73) Assignee: Nokia Corporation, Espoo (FI)

( * ) Notice: Subject to any disclaimer, the term of this patent is extended or adjusted under 35 U.S.C. 154(b) by 572 days.

(21) Appl. No.: 11/155,572

(22) Filed: Jun. 20, 2005

(65) Prior Publication Data

US 2005/0230349 A1    Oct. 20, 2005

Related U.S. Application Data

(63) Continuation of application No. 10/297,762, filed as application No. PCT/FI01/00411 on Apr. 27, 2001, now Pat. No. 6,921,868.

(30) Foreign Application Priority Data

Jun. 9, 2000    (FI) .................................. 20001384

(51) Int. Cl.
 *H05K 1/16* (2006.01)
(52) U.S. Cl. ...................... 174/260; 361/761
(58) Field of Classification Search ................. 174/260; 361/761–764
See application file for complete search history.

(56) References Cited

U.S. PATENT DOCUMENTS

| | | | |
|---|---|---|---|
| 3,996,416 A | 12/1976 | Lemke | |
| 4,792,779 A | 12/1988 | Pond et al. | |
| 4,859,806 A | 8/1989 | Smith | |
| 5,097,237 A | 3/1992 | Komazaki et al. | |
| 5,140,497 A | 8/1992 | Kato et al. | |
| 5,165,166 A | 11/1992 | Carey | |
| 5,604,658 A * | 2/1997 | Pedder | 361/277 |
| 6,046,409 A * | 4/2000 | Ishii et al. | 174/255 |
| 6,134,117 A | 10/2000 | Funk et al. | |
| 6,225,570 B1 * | 5/2001 | Ishiyama et al. | 174/260 |
| 6,229,097 B1 | 5/2001 | Suppelsa et al. | |
| 6,518,658 B2 | 2/2003 | Yoshisato et al. | |
| 6,534,861 B1 | 3/2003 | Castro | |
| 6,664,481 B1 | 12/2003 | Olofsson | |

FOREIGN PATENT DOCUMENTS

| EP | 0 926 932 A2 | 6/1999 |
|---|---|---|
| FI | 78797 | 10/1983 |
| FI | 97261 | 5/1990 |

OTHER PUBLICATIONS

Abstract of JP 6165465 A., Toshiba Corp., Apr. 4, 1986.

* cited by examiner

*Primary Examiner*—Jeremy C Norris
(74) *Attorney, Agent, or Firm*—Squire, Sanders & Dempsey L.L.P.

(57) ABSTRACT

The idea of the invention is to form a cavity in a multilayer substrate at the point of the structure to be trimmed. This enables the embedding of tolerance critical components inside substrates, such as printed circuit boards, modules, and sub-systems. Trimming is done through the cavity using, for example, a laser. After trimming the cavity is easy to fill in with a suitable dielectric material, or to cover otherwise, e.g. by using a lid, or to leave the cavity uncovered.

9 Claims, 2 Drawing Sheets

TRIMMING OF EMBEDDED STRUCTURES

REFERENCE TO RELATED APPLICATIONS

This application claims priority of Finnish Patent Application No. 20001384, filed Jun. 9, 2000. This is a Continuation of application Ser. No. 10/297,762, filed Dec. 9, 2002, which was a 371 application of International Application No. PCT/FI01/00411, filed Apr. 27, 2001. The disclosure of the prior applications is hereby incorporated by reference herein in their entirety.

FIELD OF THE INVENTION

This invention relates to trimming of structures and components in electric circuits. The invention can, for example, be utilized in multilayer ceramics technologies, in organic printed circuit boards, and in micro-electro-mechanical systems.

BACKGROUND OF THE INVENTION

The trimming of electrical structures, such as filters, resonators, and passive components, is required in order to get the system to work in the designed way. This is due to the fact that manufacturing processes may lack the required accuracy that is needed to gain the nominal values used in the design phase. Also, statistical variation within the manufacturing process of printed circuit boards, discrete components, or integrated circuits may create the need for trimming some critical parts or points. In this content trimming means cutting a structure or a component, for example by laser, until the desired electrical characteristics are achieved.

The problem so far, has been that trimming has been possible only if the component or the structure has been located on the surface of the whole structure. In other words, trimming has been possible on the surface layer. The apparatus used for trimming, such as lasers, can not penetrate through printed circuit boards. Due to this all tolerance critical parts have been placed on the top layer, which causes large circuit modules that are expensive. Structures on the surface must also be covered with a protection layer, such as an over-glaze material. This is an additional process step, increasing the cost of the structure.

Furthermore, conductor materials used on top layers must be resistive to electro-migration. (Surface layers are sensitive to electro-migration, which causes changes in electrical behavior.) For example, in multilayer ceramics technologies Ag—Pd paste material has to be used on a top layer instead of pure Ag paste for preventing unwanted migration effects. Using Ag—Pd paste instead of Ag paste results in higher conductor losses. That degrades, for example, the Q values of resonators and increases insertion loss in filter structures.

The objective of the invention is to eliminate the above-mentioned drawbacks of known solutions. This is achieved in a way described in the claims.

SUMMARY OF THE INVENTION

The idea of the invention is to form a cavity in a multilayer substrate at the point of the structure to be trimmed. This enables the embedding of tolerance critical components inside substrates, such as printed circuit boards, modules, and sub-systems. Trimming is done through the cavity using, for example, a laser. After trimming the cavity is easy to fill in with a suitable dielectric material, or to cover otherwise, e.g. by using a lid, or to leave the cavity uncovered. The invention makes it possible to insert tolerance critical structures and components into a substrate.

BRIEF DESCRIPTION OF THE DRAWINGS

In the following the invention is described in more detail by means of the attached figures, of which

DETAILED DESCRIPTION OF THE INVENTION

Figure 1:
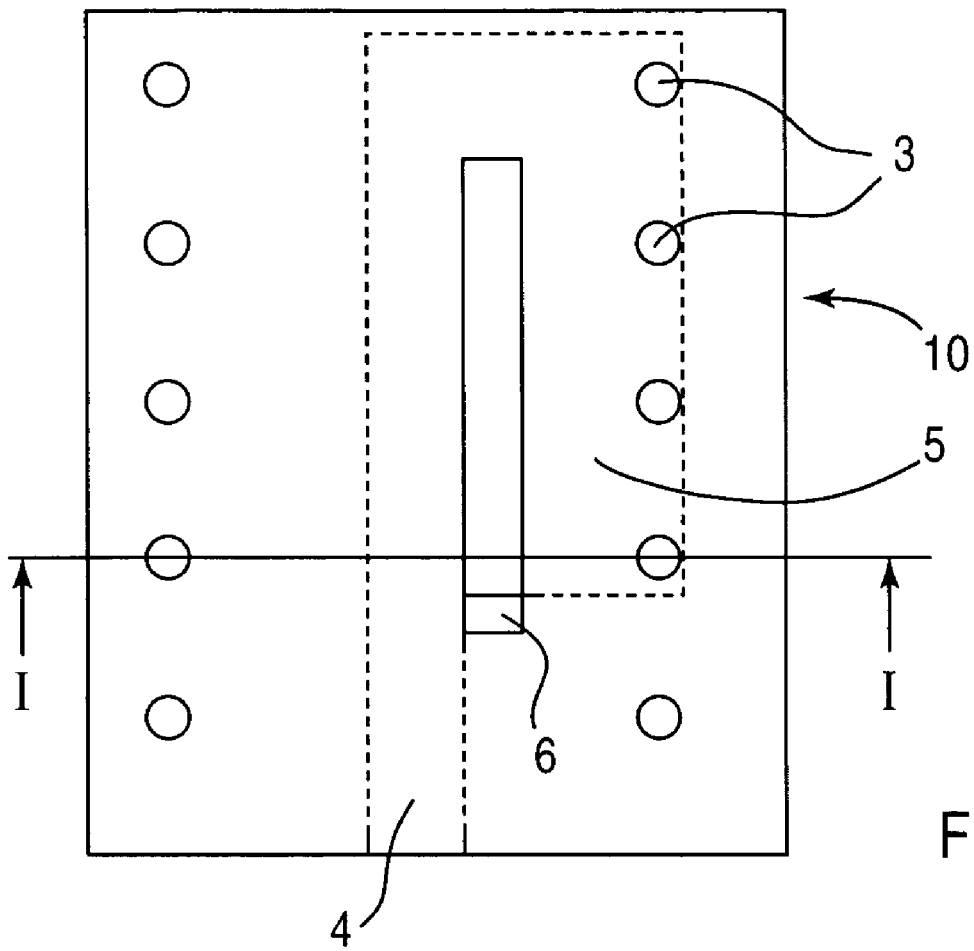
FIG. 1 illustrates an example of the top view of an embedded resonator.
Figure 2:
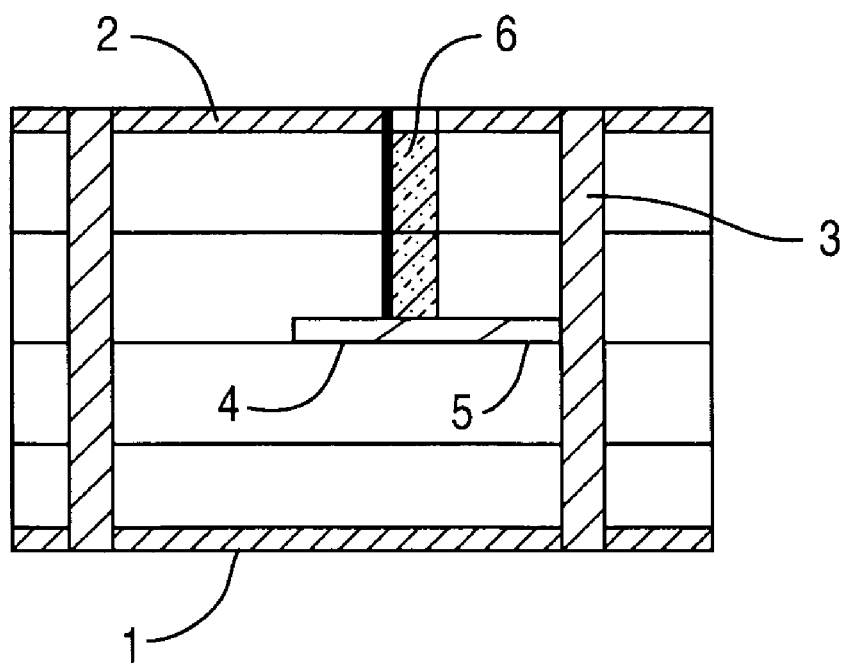
FIG. 2 is a cross-sectional view of the resonator in FIG. 1 taken along line I-I.

FIG. 1 depicts the top view of an example of an embedded resonator inside a multilayer circuit board (10) and FIG. 2 a cross section of FIG. 1. The surface of the resonator, forming a ground line, is fabricated from conductive materials, for example, so that the bottom (1) and the top (2) edges are conductive strip lines, and the sides are conductive via posts (3). In the center of the resonator there is a conductive strip line (4) forming a signal line, which is connected to the surface of the resonator via an extension (5) forming a short circuit between the signal line and the ground line. The structure includes also a cavity (6) that partially discloses the short circuit between the signal and ground lines.

It can be seen that the resonator length, i.e. the location of the short circuit, can be easily trimmed, for example, with a laser by pointing the laser through the cavity towards the printed circuit board and by cutting the short circuit extension between the signal line and the ground line until the desired length is reached.

Figure 3:
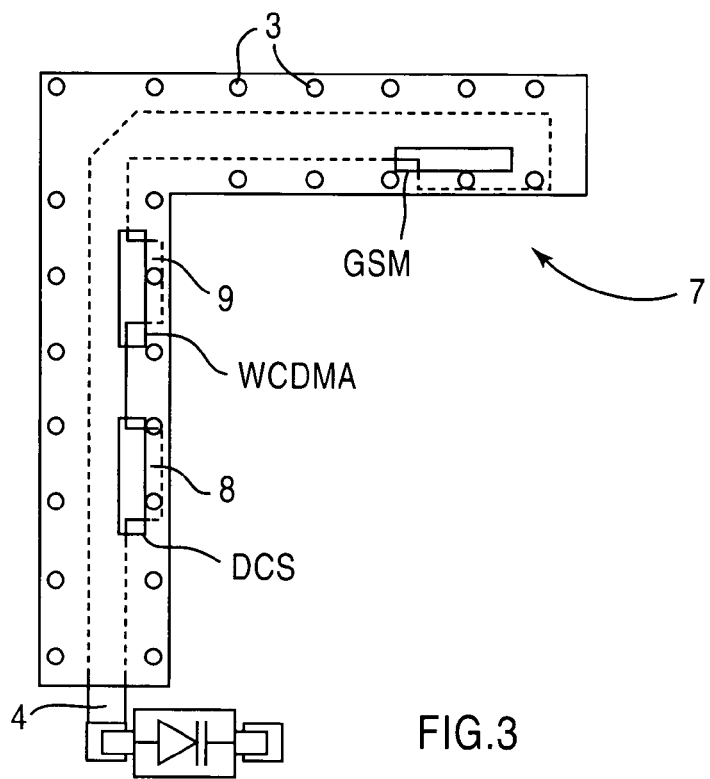
FIG. 3 illustrates an example of an embedded multiband module resonator.

FIG. 3 depicts an example of an embedded module multiband resonator (7), which can be used in a desired frequency area (DCS, WCDMA, or GSM). In this case it is possible to separate the signal and the ground line totally from each other at the points of the cavities. In other words, it is possible to separate parts of the circuitry. There are several trimming cavities (DCS, WCDMA, GSM) in the printed circuit board. Trimming is done so that the choice of the frequency area is done by cutting short circuit extensions open through cavities in higher frequency areas and fine tuning is done through the cavity in the desired frequency area. If the resonator is planned to be used in a DCS (Digital Cellular System) area, the fine tuning is done through the DCS cavity by cutting a suitable length of the extension away until the desired value is achieved. If the resonator is planned to be used in a WCDMA (wideband code-division multiple access) area, the fine tuning is done through the WCDMA cavity, and if the resonator is planned to be used in a GSM area, the fine tuning is done through the GSM (Global System for Mobile Communication) cavity.

For example, the resonator (7) can be trimmed to the WCDMA area when the short circuit extension (8) in the DCS area is cut totally open by a laser through the first cavity (DCS) and the fine tuning is done by cutting the desired length of the short circuit extension (9) open through the second cavity (WCDMA). In this case there is no need to use the third cavity (GSM) but in the case of using the resonator in a GSM area, the short circuit extensions (8,9) are cut totally open through the first and the second cavity, and the fine tuning is done through the third cavity. So it is possible to use one module structure in different frequency areas. The number of trimming cavities depends on the case.

Similar structures can be used in order to suppress spurious harmonics. Both before-mentioned structures can be used, for example, in voltage-controlled oscillators.

Figure 4:
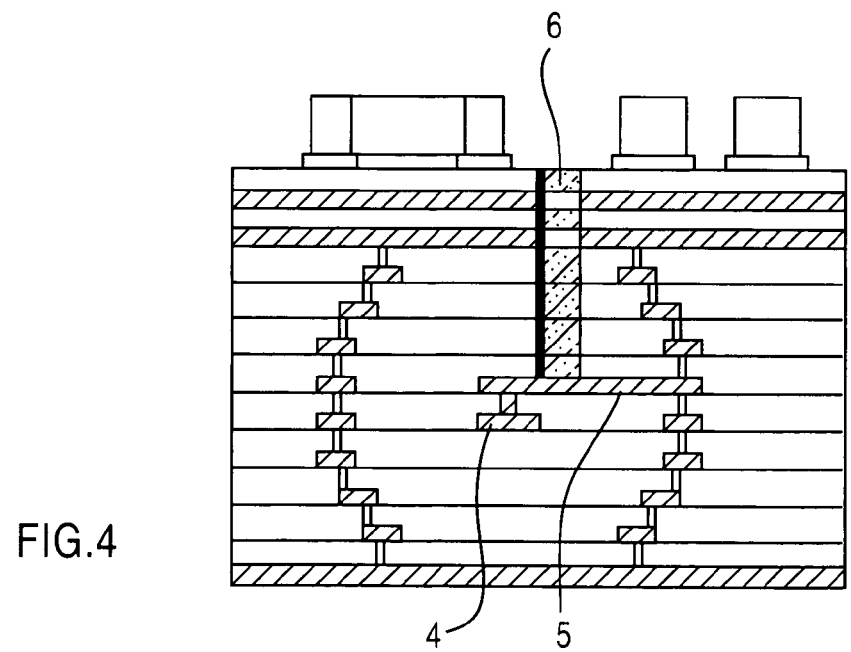
FIG. 4 illustrates an example of an embedded coaxial resonator.

In the example of FIG. 4 the transmission line used is a multilayer coaxial line. From the figure it can be clearly noted that a large amount of surface area can be saved, and discrete components can be placed on the top of the resonator structure.

The invention enables the trimming of tolerance critical components inside printed circuit boards, modules, and subsystems. This means savings of printed circuit board area and costs. Enhanced electrical performance can also be reached because higher conductive conductor materials can be used. Embedded structures are well EMC shielded and isolation is better than in conventionally trimmed structures.

There exist several other options than above-mentioned to use the invention as well. The structure to be trimmed can be, instead of a simple transmission line, a passive component, such as a resistor, a capacitor, or an inductor. Also, the purpose of transmission line trimming can be different than to remove or move the termination of the line. It can, for example, be used to change transmission line properties of the signal line by changing the width of the conductors. So it is evident that the invention is not restricted to the before-mentioned examples, but it can be used in other solutions within the scope of the inventive idea.

The invention claimed is:

1. An apparatus comprising:
   a substrate including a cavity disposed therein; and
   a conductive element embedded inside the substrate, said conductive element having at least one extension connecting said conductive element to a further conductive element transverse to said conductive element;
   wherein the cavity extends between a surface of the substrate and one of said at least one extension of said conductive element, and wherein the substrate is configured such that the conductive element is trimmed through the cavity by cutting at least part of said one of said at least one extension by a trimming element, wherein the conductive element to be trimmed is included in a resonator.

2. The apparatus according to claim 1, wherein said substrate includes a plurality of conductive elements to be trimmed and a plurality of cavities.

3. The apparatus according to claim 1, wherein resonator comprises a multiband resonator.

4. The arrangement apparatus according to claim 1, wherein the resonator comprises a multiband resonator, and said substrate comprises at least two cavities for cutting extensions of said conductive element.

5. The apparatus according to claim 1, wherein said trimming of said conductive element provides a desired resonator frequency for a telecommunication access technology.

6. The apparatus according to claim 5, wherein said access technology comprises one or more of digital cellular system (DCS), wideband code-division multiple access (WCDMA), and global system for mobile communication (GSM).

7. The apparatus according to claim 1, wherein said substrate comprises a plurality of conductive elements to be trimmed and a plurality of activities, each of said plurality of cavities and conductive elements relating to a respective one of a plurality of telecommunication access technologies.

8. An apparatus comprising:
   a substrate;
   a conductive element and a further conductive element embedded inside the substrate, said conductive element having at least one extension connecting said conductive element to said further conductive element, said further conductive element being transverse to said conductive element; and
   a cavity which extends between a surface of the substrate and one of said at least one extension of said conductive element for cutting at least part of said one of said at least one extension, and wherein the conductive element to be cut is included in a resonator.

9. An apparatus comprising:
   a substrate;
   a conductive element embedded inside the substrate; and
   a filled cavity, said cavity having extended between a surface of the substrate and one of at least one extension of said conductive element and having been filled with at least one of a resistive material and a dielectric material;
   wherein said substrate is configured by cutting at least part of said one of at least one extension connecting the conductive element to a further part of a circuitry by a trimming element through said cavity before filling said cavity, and wherein the conductive element to be cut is included in a resonator.

* * * * *